United States Patent
Sugiyama et al.

(10) Patent No.: US 12,362,264 B2
(45) Date of Patent: Jul. 15, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toru Sugiyama, Musashino (JP); Akira Yoshioka, Yokohama (JP); Hung Hung, Kawasaki (JP); Yasuhiro Isobe, Ota (JP); Hitoshi Kobayashi, Yamato (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 509 days.

(21) Appl. No.: 17/653,201

(22) Filed: Mar. 2, 2022

(65) Prior Publication Data

US 2023/0080613 A1 Mar. 16, 2023

(30) Foreign Application Priority Data

Sep. 13, 2021 (JP) .................................. 2021-148365

(51) Int. Cl.
*H01L 23/495* (2006.01)
*H01L 23/00* (2006.01)
(Continued)

(52) U.S. Cl.
CPC .. *H01L 23/49513* (2013.01); *H01L 23/49575* (2013.01); *H01L 24/32* (2013.01);
(Continued)

(58) Field of Classification Search
CPC . H01L 23/49562; H01L 24/48; H01L 29/778; H01L 23/495; H01L 23/49513;
(Continued)

(56) References Cited

U.S. PATENT DOCUMENTS 8,796,816 B2  8/2014 Hayashi et al.
9,300,223 B2  3/2016 Ikeda
(Continued)

FOREIGN PATENT DOCUMENTS

JP  5099243 B2  12/2012
JP  2014-78570 A  5/2014
JP  5668707 B2  2/2015

*Primary Examiner* — Mouloucoulaye Inoussa
(74) *Attorney, Agent, or Firm* — Knobbe, Martens, Olson & Bear, LLP

(57) ABSTRACT

A semiconductor device includes a first terminal, a second terminal, a first chip, and a resistance part. The first chip includes a substrate electrically connected to the second terminal, a nitride semiconductor layer located on the substrate, a first drain electrode located on the nitride semiconductor layer and electrically connected to the first terminal, a first source electrode located on the nitride semiconductor layer and electrically connected to the second terminal, and a substrate capacitance between the first drain electrode and the substrate. The resistance part is connected in series in a path including the substrate capacitance between the first drain electrode and the second terminal.

10 Claims, 15 Drawing Sheets

(51) Int. Cl.
*H01L 25/07* (2006.01)
*H10D 30/47* (2025.01)
*H10D 62/85* (2025.01)

(52) U.S. Cl.
CPC ............ *H01L 24/48* (2013.01); *H01L 25/072* (2013.01); *H10D 30/47* (2025.01); *H10D 62/8503* (2025.01); *H01L 2224/32245* (2013.01); *H01L 2224/48245* (2013.01)

(58) Field of Classification Search
CPC ... H01L 24/49; H01L 24/32; H01L 23/49575; H01L 25/072; H01L 29/2003; H01L 24/73; H01L 29/7786; H01L 23/645; H01L 23/49531; H01L 25/0657; H01L 23/5386; H01L 23/49589; H01L 23/66; H01L 24/24; H01L 29/1608; H01L 23/49548; H01L 23/5385; H01L 23/3677; H01L 25/50; H01L 23/49838; H01L 21/56; H01L 23/49811; H01L 25/18; H01L 23/49833; H01L 23/49822; H01L 23/367; H01L 23/3107; H01L 23/3736; H01L 25/0655; H01L 23/3114; H01L 25/04; H01L 2224/49111; H01L 2224/48245; H01L 2924/1033; H01L 2224/48137; H01L 2224/48091; H01L 2224/0603; H01L 2224/48247; H01L 2224/05554; H01L 2224/32013; H01L 2224/48257; H01L 2924/19105; H01L 2924/13064; H01L 2224/29144; H01L 2224/24175; H01L 2224/24247; H01L 2224/83805; H01L 2223/6683; H01L 2224/73267; H01L 2924/19107; H01L 2224/29339; H01L 2224/73209; H01L 2224/73265; H01L 2223/6672; H01L 2223/6611; H01L 2224/73253; H01L 2924/014; H01L 2924/0105; H01L 2924/00014; H01L 2224/29111; H01L 2924/01079; H01L 2224/131; H01L 2224/1329; H01L 2224/133; H01L 2224/49175; H01L 2223/6655; H01L 2223/665; H03F 3/213; H03F 3/193; H03F 3/195; H03F 1/30; H03F 1/565; H03F 1/0288; H03F 3/24; H03F 2200/451; H03F 2200/447; H03F 2203/21103; H03F 2200/387; H03F 2200/75; H04B 1/0458; H02M 3/158
USPC ... 257/777, 195, 676, 76, E25.029, E23.052, 257/E23.124, E27.012, E27.016; 327/382, 427; 438/107; 361/782; 363/126

See application file for complete search history.

(56) References Cited

U.S. PATENT DOCUMENTS

| | | | | |
|---|---|---|---|---|
| 9,806,706 | B2 * | 10/2017 | Hasegawa | H03K 17/102 |
| 10,903,182 | B1 * | 1/2021 | Wang | H03F 3/211 |
| 2007/0187807 | A1 * | 8/2007 | Lee | H01M 10/425 |
| | | | | 257/676 |
| 2008/0191216 | A1 * | 8/2008 | Machida | H01L 29/7786 |
| | | | | 257/E27.012 |
| 2009/0167411 | A1 * | 7/2009 | Machida | H01L 27/0605 |
| | | | | 327/427 |
| 2010/0019391 | A1 * | 1/2010 | Strzalkowski | H01L 23/495 |
| | | | | 257/777 |
| 2013/0147540 | A1 * | 6/2013 | Wu | H01L 23/49838 |
| | | | | 257/195 |
| 2014/0098585 | A1 * | 4/2014 | Ikeda | H01L 27/0629 |
| | | | | 257/195 |
| 2014/0240945 | A1 * | 8/2014 | Hosseini | H01L 24/84 |
| | | | | 438/107 |
| 2014/0284610 | A1 * | 9/2014 | Yoshioka | H01L 27/0629 |
| | | | | 257/195 |
| 2017/0194237 | A1 * | 7/2017 | Kinzer | H01L 24/06 |
| 2019/0140598 | A1 * | 5/2019 | Schultz | H04B 1/0458 |
| 2019/0279948 | A1 * | 9/2019 | Moreau | H01L 25/18 |
| 2020/0105741 | A1 * | 4/2020 | Lin | H01L 21/761 |
| 2020/0286880 | A1 * | 9/2020 | Ashimine | H01L 27/016 |
| 2021/0075374 | A1 * | 3/2021 | Wang | H03F 3/604 |
| 2021/0202357 | A1 * | 7/2021 | Poddar | H01L 23/49503 |
| 2021/0226444 | A1 * | 7/2021 | Fang | H03K 17/08142 |
| 2021/0313284 | A1 * | 10/2021 | Noori | H01L 24/24 |
| 2021/0313285 | A1 * | 10/2021 | Noori | H03F 3/193 |
| 2021/0391311 | A1 * | 12/2021 | Rhodes | H01L 25/18 |
| 2021/0408273 | A1 * | 12/2021 | Wu | H01L 29/7786 |
| 2022/0208670 | A1 * | 6/2022 | Jones | H03F 3/213 |

* cited by examiner

TIME (ns)

SEMICONDUCTOR DEVICE

CROSS-REFERENCE TO RELATED APPLICATION

This application is based upon and claims the benefit of priority from Japanese Patent Application No. 2021-148365, filed on Sep. 13, 2021; the entire contents of which are incorporated herein by reference.

FIELD

Embodiments described herein relate generally to a semiconductor device.

BACKGROUND

For example, a lateral HEMT (High Electron Mobility Transistor) that uses gallium nitride (GaN) is used as a power device. Such GaN devices have a unique phenomenon in which the on-resistance may undesirably increase when switching. There are cases where the substrate of a GaN device is set to the source potential to suppress such an on-resistance increase.

DETAILED DESCRIPTION

Figure 1:
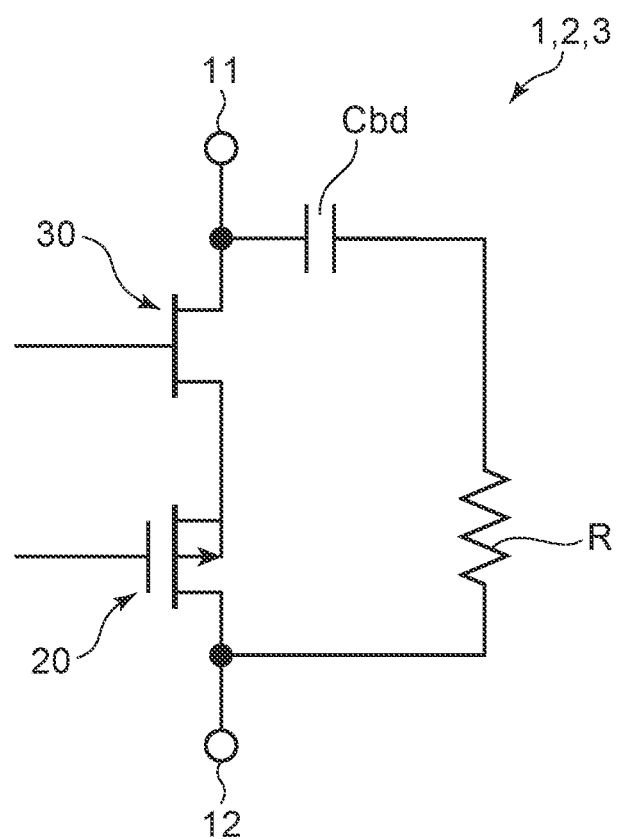
FIG. 1 is an equivalent circuit diagram of semiconductor devices of first to fourth embodiments.

According to one embodiment, a semiconductor device includes a first terminal, a second terminal, a first chip, and a resistance part. The first chip includes a substrate electrically connected to the second terminal, a nitride semiconductor layer located on the substrate, a first drain electrode located on the nitride semiconductor layer and electrically connected to the first terminal, a first source electrode located on the nitride semiconductor layer and electrically connected to the second terminal, and a substrate capacitance between the first drain electrode and the substrate. The resistance part is connected in series in a path including the substrate capacitance between the first drain electrode and the second terminal.

Embodiments will now be described with reference to the drawings. The same components in the drawings are marked with the same reference numerals.

First Embodiment

A semiconductor device 1 of a first embodiment will now be described with reference to FIGS. 1 to 4.

As shown in FIG. 1, the semiconductor device 1 includes a first terminal 11, a second terminal 12, a first chip 30, and a second chip 20. The first chip 30 and the second chip 20 have a cascode connection between the first terminal 11 and the second terminal 12.

The first chip 30 includes, for example, a normally-on HEMT (High Electron Mobility Transistor) that is on when no input signal is applied to the gate.

Figure 4:
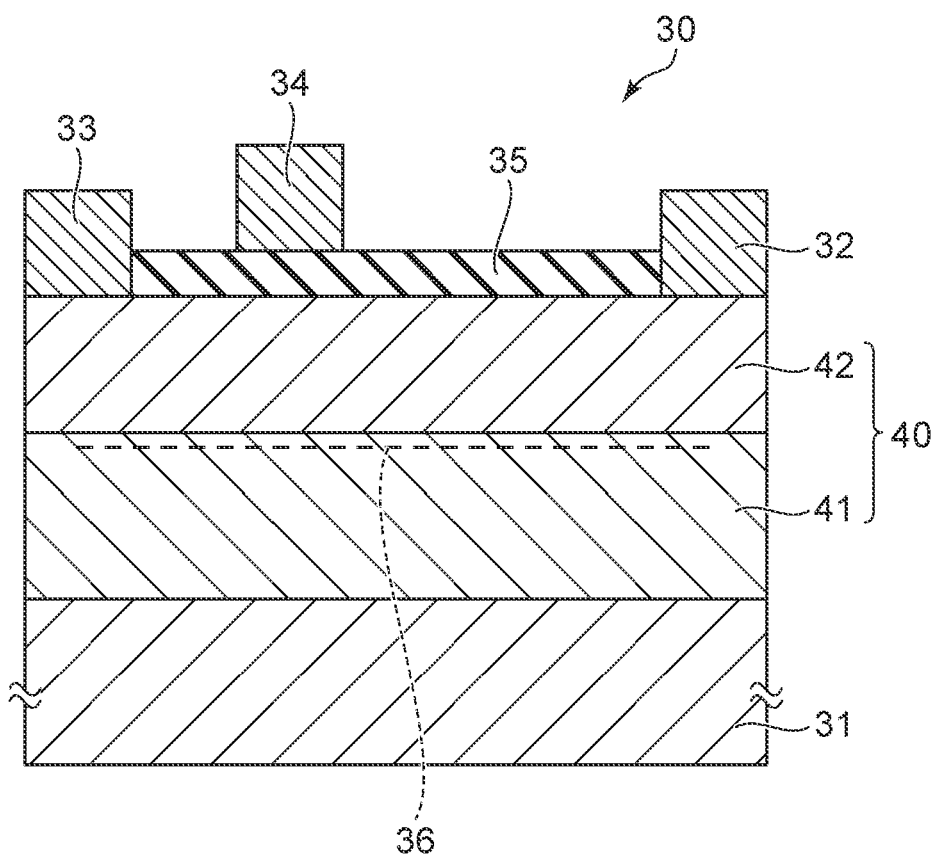
FIG. 4 is a schematic cross-sectional view of a first chip of the first to third and fifth to seventh embodiments.

As shown in FIG. 4, the first chip 30 includes a substrate 31, and a first semiconductor layer 40 located on the substrate 31. The first semiconductor layer 40 has a heterojunction structure of a first nitride semiconductor layer 41 and a second nitride semiconductor layer 42. The first nitride semiconductor layer 41 is located on the substrate 31; and the second nitride semiconductor layer 42 is located on the first nitride semiconductor layer 41. The second nitride semiconductor layer 42 has a larger bandgap than the first nitride semiconductor layer 41. For example, the first nitride semiconductor layer 41 is an undoped GaN layer; and the second nitride semiconductor layer 42 is an AlGaN layer. A two-dimensional electron gas 36 is formed in the first nitride semiconductor layer 41 at the vicinity of the interface with the second nitride semiconductor layer 42.

A first drain electrode 32 and a first source electrode 33 are located on the second nitride semiconductor layer 42. The first drain electrode 32 and the first source electrode 33 contact the second nitride semiconductor layer 42. A first gate electrode 34 is located on the second nitride semiconductor layer 42 at a region between the first drain electrode 32 and the first source electrode 33 with an insulating film 35 interposed.

The substrate 31 is, for example, a silicon substrate. The resistance value of the substrate 31 is, for example, not less than 1 mΩ·cm and not more than 1 Ω·cm. The first chip 30 includes a substrate capacitance Cbd between the first drain electrode 32 and the substrate 31.

Figure 2:
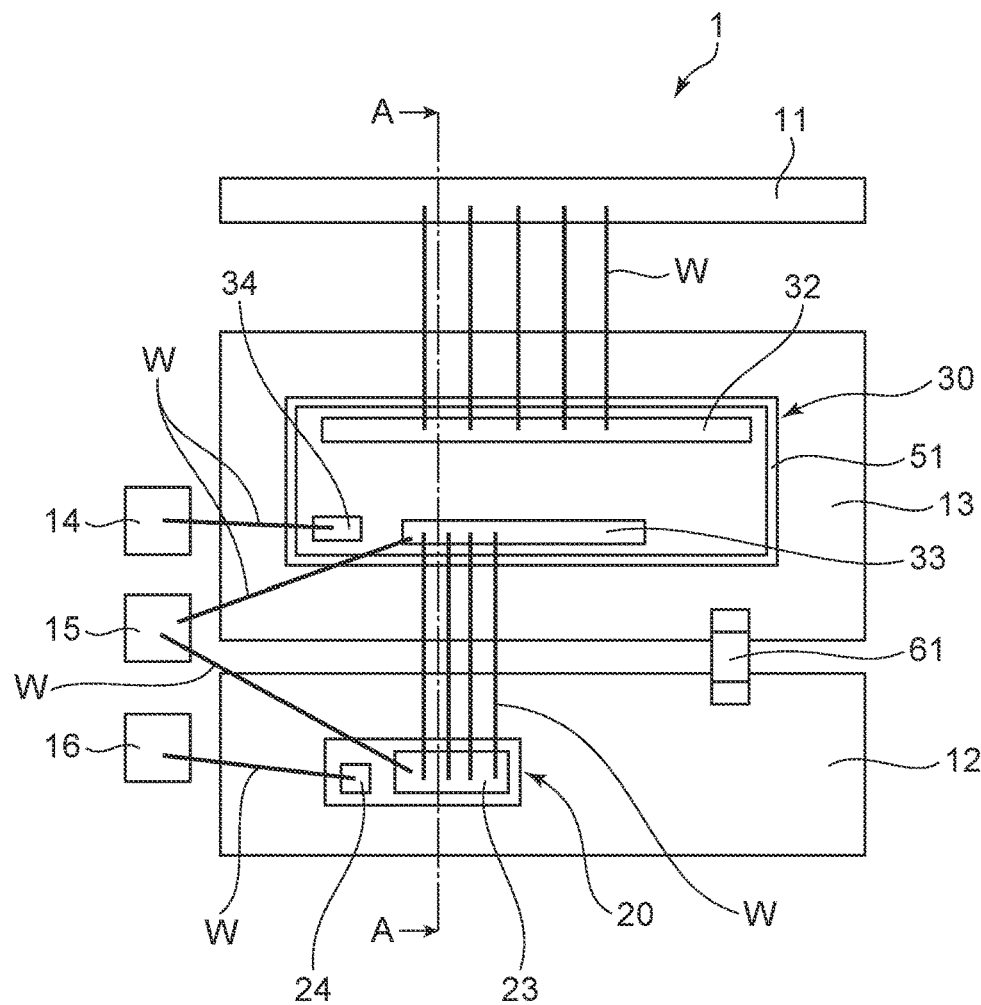
FIG. 2 is a schematic plan view of the semiconductor device of the first embodiment.
Figure 3:
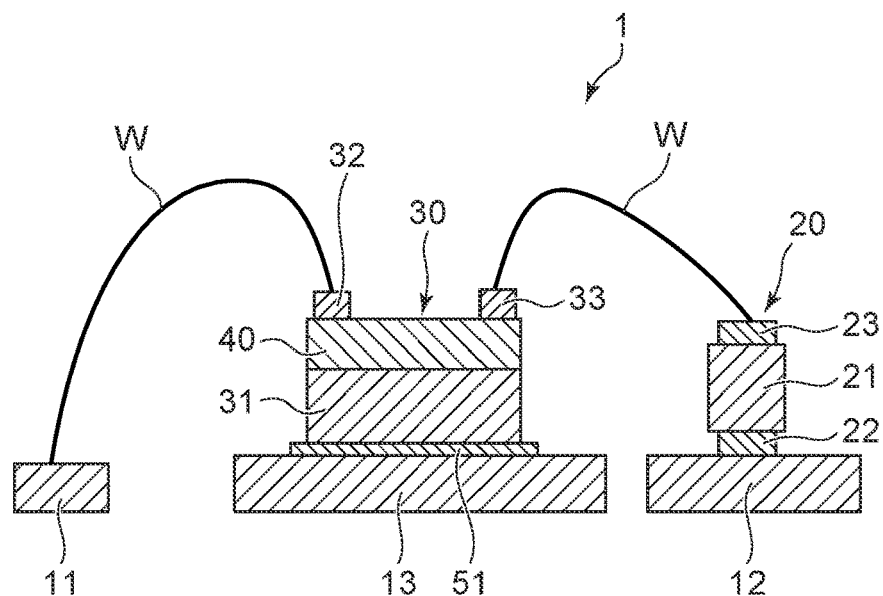
FIG. 3 is a schematic cross-sectional view illustrating an A-A cross section of FIG. 2.

As shown in FIGS. 2 and 3, the semiconductor device 1 further includes a die pad 13, a first gate terminal 14, a second gate terminal 16, and a power supply terminal 15. The first terminal 11, the second terminal 12, the die pad 13, the first gate terminal 14, the second gate terminal 16, and the power supply terminal 15 are included in a leadframe that is a metal member. The leadframe, the first chip 30, and the second chip 20 are packaged by being covered with a resin.

The first chip 30 is mounted on the die pad 13. The substrate 31 of the first chip 30 is bonded to the die pad 13 by a bonding member 51. The material of the bonding member 51 is, for example, solder, Ag paste, etc.

The first drain electrode 32 of the first chip 30 is electrically connected to the first terminal 11 by a wire W. The first source electrode 33 of the first chip 30 is electrically connected to the power supply terminal 15 by a wire W. The first gate electrode 34 of the first chip 30 is electrically connected to the first gate terminal 14 by a wire W.

The second chip 20 is normally-off, that is, off when no input signal is applied to the gate, and includes, for example, a p-type channel MOSFET (Metal-Oxide-Semiconductor Field Effect Transistor).

The second chip 20 includes a second semiconductor layer 21, a second drain electrode 22 located at one surface in the thickness direction of the second semiconductor layer 21, a second source electrode 23 located at the other surface in the thickness direction of the second semiconductor layer 21, and a second gate electrode 24 located at the other surface. The second semiconductor layer 21 is, for example, a silicon layer and includes a p-type channel. The second chip 20 is a vertical device in which a current flows in the thickness direction of the second semiconductor layer 21 (the vertical direction connecting the second drain electrode 22 and the second source electrode 23).

The second chip 20 is mounted on the second terminal 12. For example, the second drain electrode 22 of the second chip 20 is bonded to the second terminal 12 by a bonding member such as solder, etc. The second drain electrode 22 is electrically connected to the second terminal 12.

The second source electrode 23 of the second chip 20 is electrically connected to the power supply terminal 15 and the first source electrode 33 of the first chip 30 by wires W. The second gate electrode 24 of the second chip 20 is electrically connected to the second gate terminal 16 by a wire W. The first source electrode 33 of the first chip 30 is electrically connected to the second terminal 12 via the second chip 20.

As shown in FIG. 1, the semiconductor device 1 includes a resistance part R that is connected in series in a path including the substrate capacitance Cbd between the second terminal 12 and the first drain electrode 32 of the first chip 30. The resistance part R is not a parasitic resistance, but is a resistance part that is intentionally inserted into the aforementioned path. For example, the resistance of the resistance part R is greater than the resistance of the substrate 31 of the first chip 30.

The semiconductor device 1 of the first embodiment includes a chip resistor 61 shown in FIG. 2 as the resistance part R. The chip resistor 61 is electrically connected between the second terminal 12 and the die pad 13 that is bonded to the substrate 31 of the first chip 30.

Series resonance that may occur between the substrate capacitance Cbd of the first chip 30 and parasitic inductances of wires, wiring, etc., is one cause of ringing of the drain current. Normally, to suppress such ringing, a large external gate resistance is inserted to lower dV/dt (the drain-source voltage change amount per unit time in the switching transitional period). However, when dV/dt decreases, the switching loss increases, and the circuit efficiency decreases.

According to the embodiment, the resistance part R is connected in series in the path that includes the substrate capacitance Cbd between the second terminal 12 and the first drain electrode 32 of the first chip 30. The resistance part R is included in an RC snubber circuit with the substrate capacitance Cbd. The energy of the series resonance between the substrate capacitance Cbd and the parasitic inductance can be consumed (absorbed) by the resistance part R (the snubber resistance); and the ringing of the drain current can be suppressed.

By suppressing the ringing of the drain current, the gate resistance can be reduced, and stable operation at a high dV/dt is possible. As a result, the switching loss is reduced, which can help increase the circuit efficiency.

Other embodiments will now be described. According to the other embodiments, the same configurations as the first embodiment are marked with the same reference numerals; and a detailed description thereof is omitted. According to the other embodiments as well, similarly to the first embodiment, the resistance part R is connected in series in the path that includes the substrate capacitance Cbd between the second terminal 12 and the first drain electrode 32 of the first chip 30. Accordingly, according to the other embodiments as well, the energy of the series resonance between the substrate capacitance Cbd and the parasitic inductance can be consumed (absorbed) by the resistance part R (the snubber resistance); and the ringing of the drain current can be suppressed.

Second Embodiment

Figure 5:
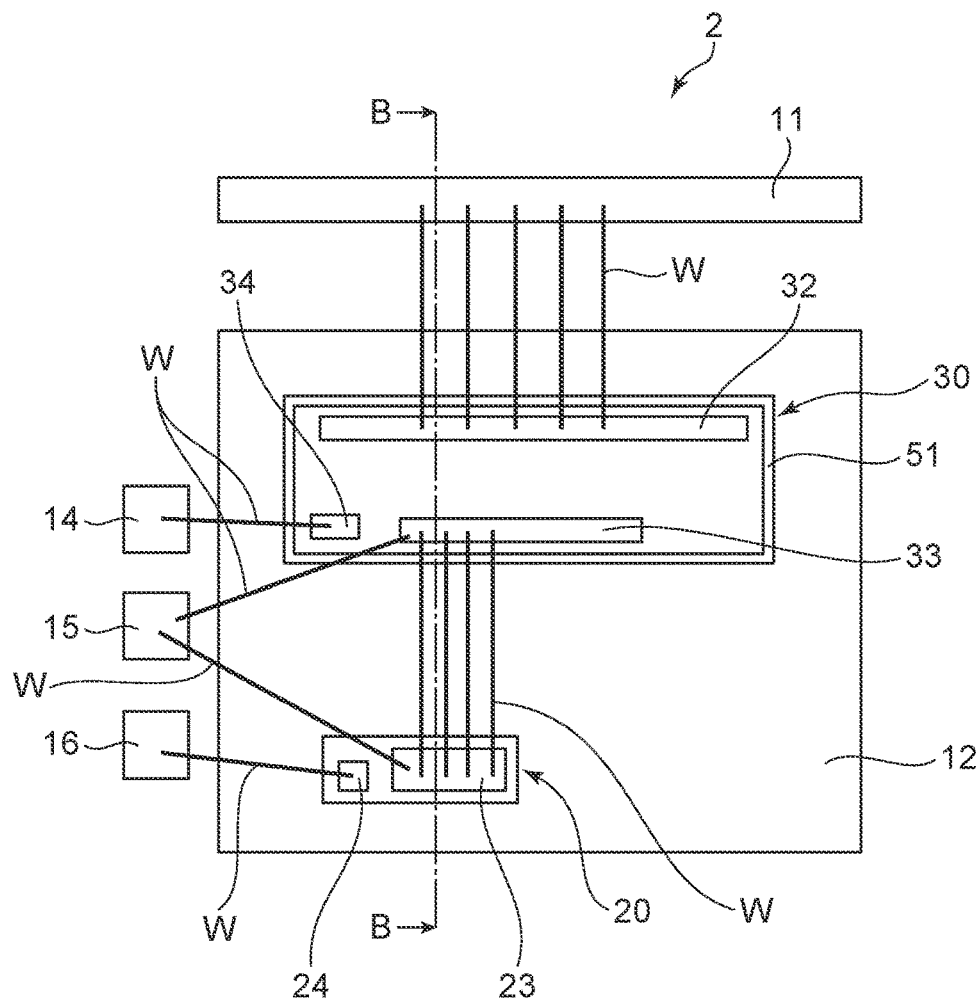
FIG. 5 is a schematic plan view of a semiconductor device of the second embodiment.
Figure 6:
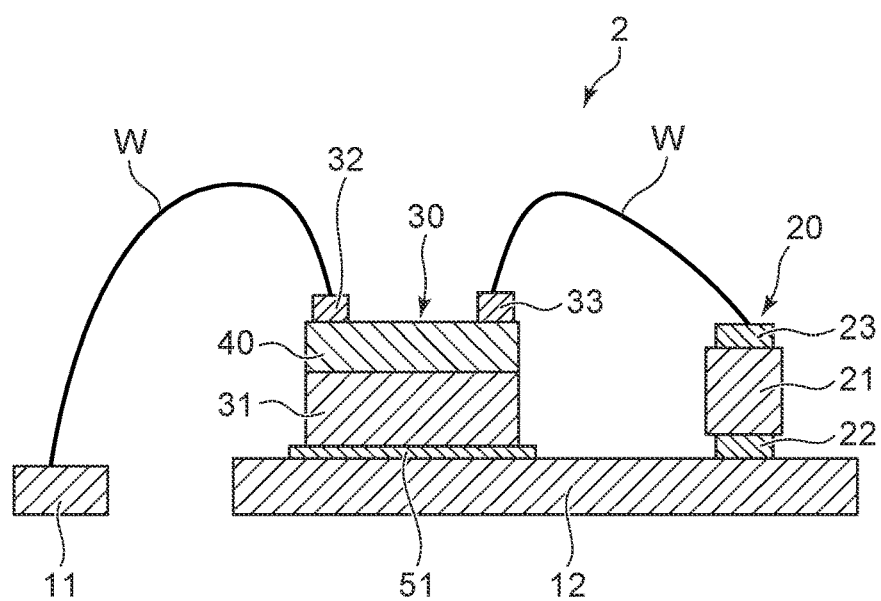
FIG. 6 is a schematic cross-sectional view illustrating a B-B cross section of FIG. 5.

A semiconductor device 2 of a second embodiment is described with reference to FIGS. 5 and 6.

According to the second embodiment, the first chip 30 and the second chip 20 are mounted on the second terminal 12. In other words, the second terminal 12 also is used as the die pad to which the first chip 30 is mounted. The substrate 31 of the first chip 30 is bonded to the second terminal 12 by the bonding member 51. According to the second embodiment, the resistance part R includes the bonding member 51 that bonds the substrate 31 and the second terminal 12 (that also is used as the die pad). For example, Ag paste that has a reduced Ag percentage is favorable as the material of the bonding member 51 that is used as the resistance part R.

Third Embodiment

Figure 7:
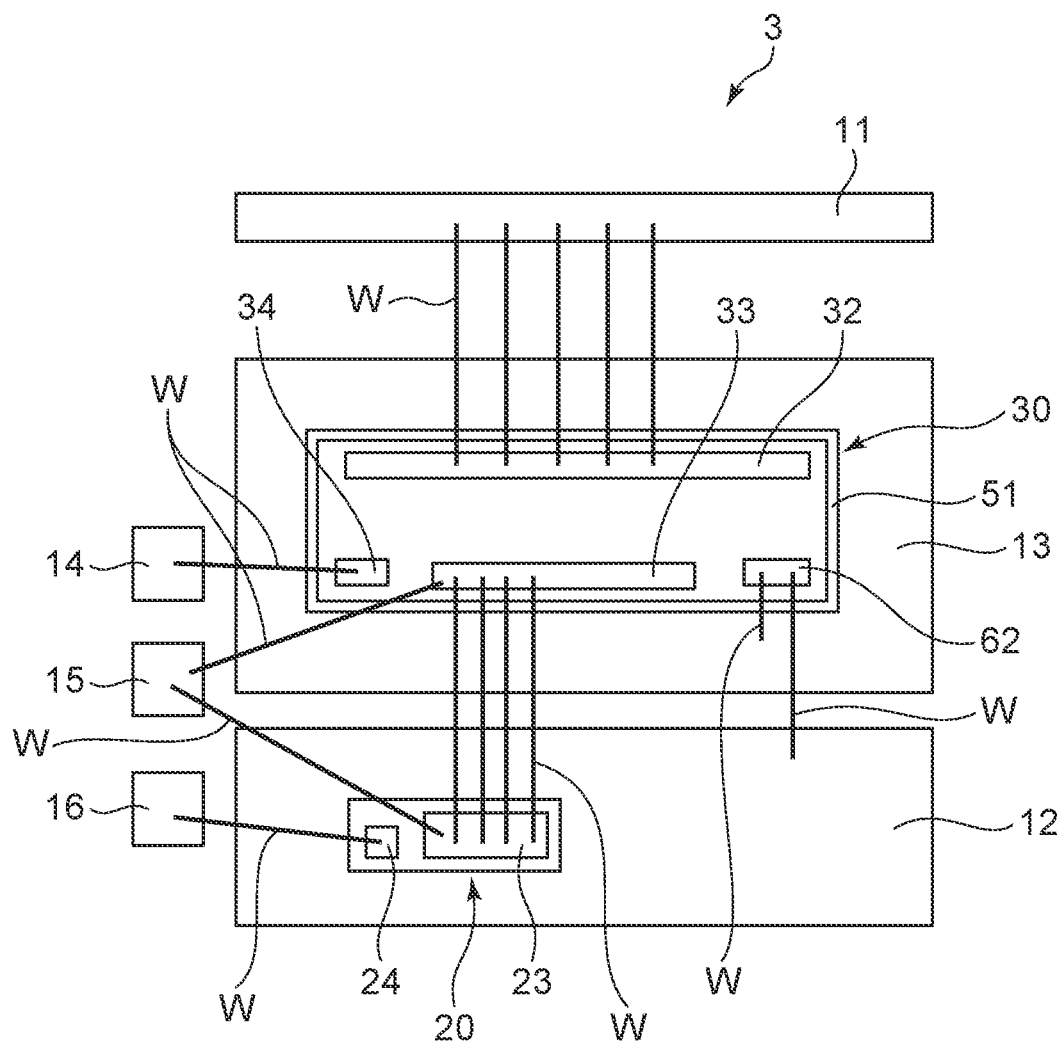
FIG. 7 is a schematic plan view of the semiconductor device of the third embodiment.

A semiconductor device 3 of a third embodiment is described with reference to FIG. 7.

A resistance part 62 according to the third embodiment is located on the first chip 30. The resistance part 62 is electrically connected to the die pad 13 and the second terminal 12 by wires W. The material of the resistance part 62 is, for example, a thin film resistance formed on the first chip 30. Or, the resistance of the resistance part R connected to the path that includes the substrate capacitance Cbd between the first drain electrode 32 and the second terminal 12 can be adjusted by adjusting the resistance of the GaN HEMT itself by adjusting the aspect ratios of the first drain electrode 32 and the first source electrode 33 shown in FIG. 4 when viewed in top-view. In other words, in such a case, the first drain electrode 32 and the first source electrode 33 may function as the resistance part 62 on the first chip 30.

Fourth Embodiment

Figure 8:
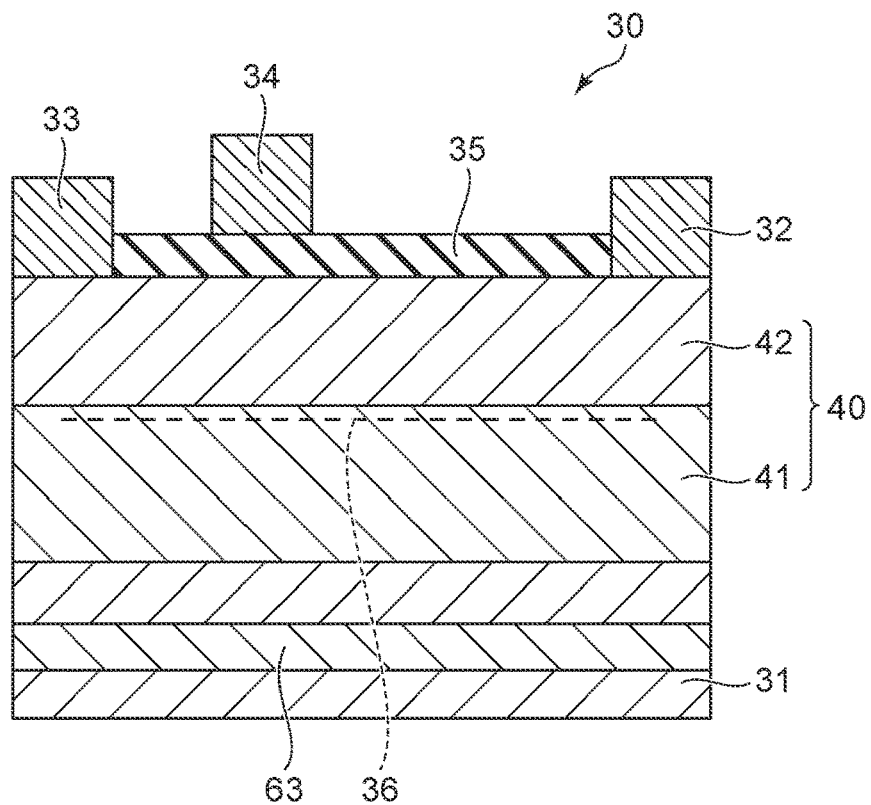
FIG. 8 is a schematic cross-sectional view of the first chip of the fourth embodiment.

FIG. 8 is a schematic cross-sectional view of the first chip 30 of a fourth embodiment.

According to the fourth embodiment, the resistance part R includes a resistance layer 63 located at the substrate 31 of the first chip 30. The resistance layer 63 is, for example, a low boron-doped high-resistance Si layer. Also, the resistance layer 63 may be provided in a region of the nitride semiconductor layer 41 or 42 between the first drain electrode 32 and the substrate 31.

Fifth Embodiment

Figure 9:
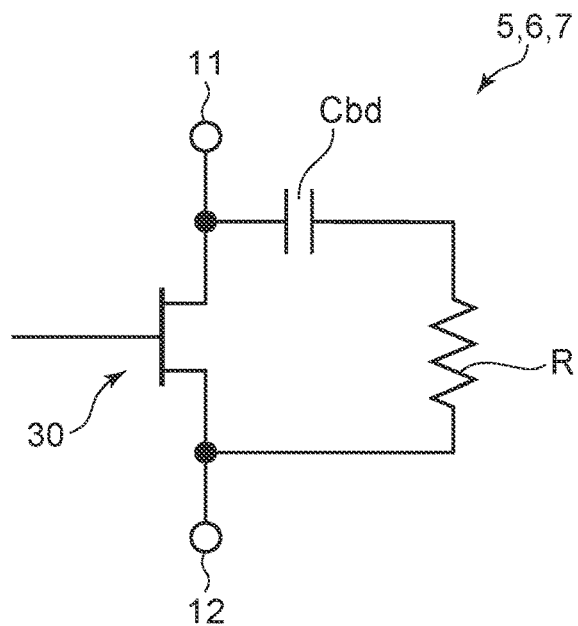
FIG. 9 is an equivalent circuit diagram of semiconductor devices of the fifth to eighth embodiments.

A semiconductor device 5 of a fifth embodiment will now be described with reference to FIGS. 9 to 11.

The semiconductor device 5 includes the first terminal 11, the second terminal 12, and the first chip 30. The first drain electrode 32 of the first chip 30 is electrically connected to the first terminal 11; and the first source electrode 33 is electrically connected to the second terminal 12.

The semiconductor device 5 does not include the second chip 20. The first chip 30 of the semiconductor device 5 includes, for example, a normally-off HEMT that is off when no input signal is applied to the gate.

Figure 10:
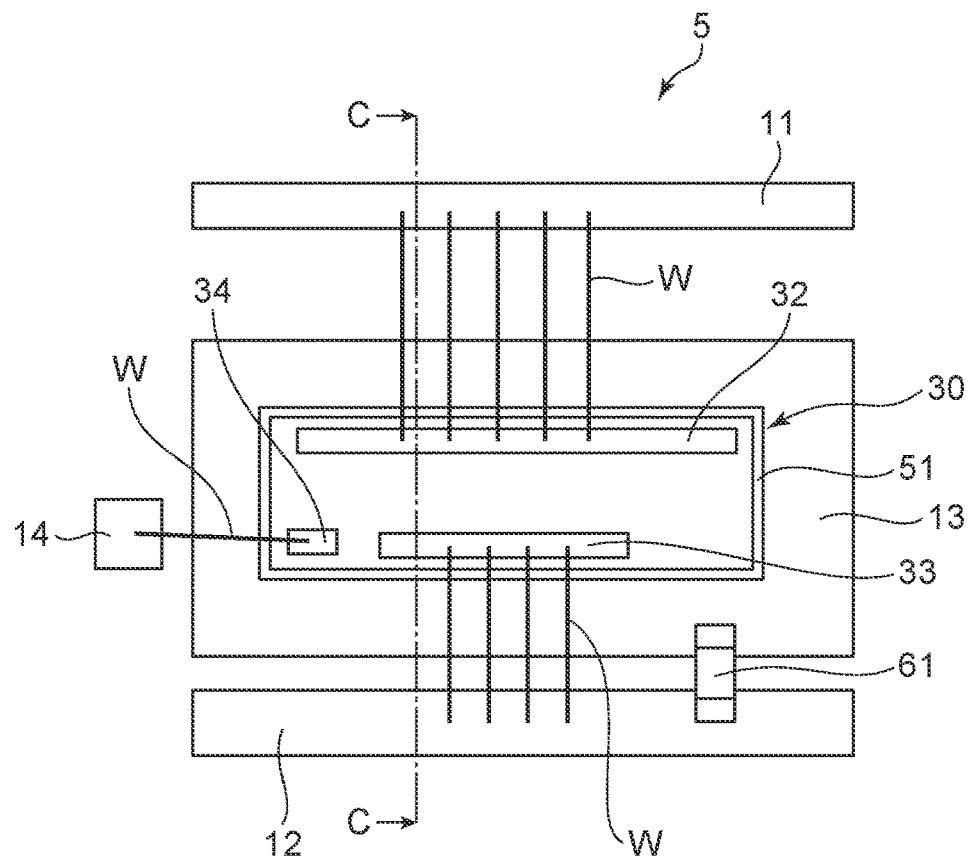
FIG. 10 is a schematic plan view of the semiconductor device of the fifth embodiment.
Figure 11:
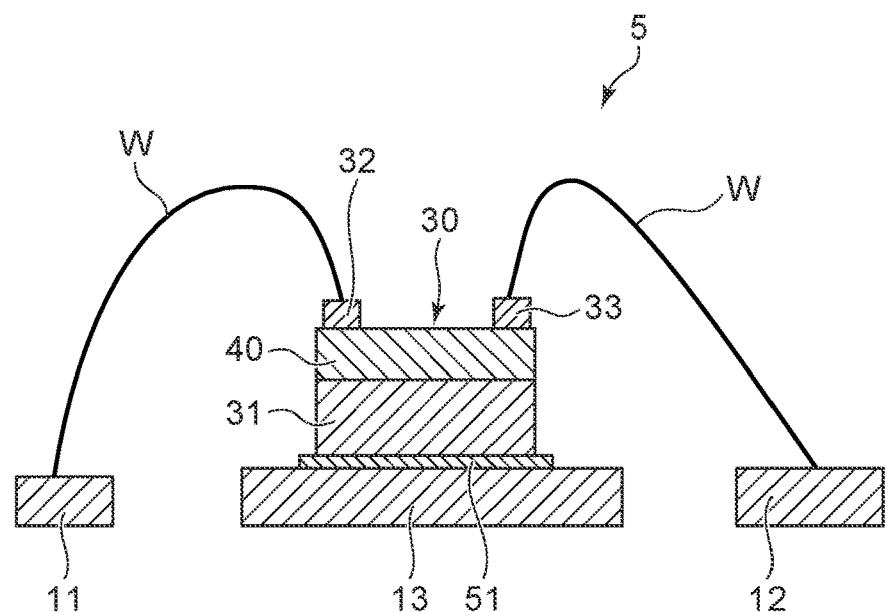
FIG. 11 is a schematic cross-sectional view illustrating a C-C cross section of FIG. 10.

The semiconductor device 5 of the fifth embodiment includes the chip resistor 61 shown in FIG. 10 as the resistance part R. The chip resistor 61 is electrically connected between the second terminal 12 and the die pad 13 that is bonded to the substrate 31 of the first chip 30.

Sixth Embodiment

Figure 12:
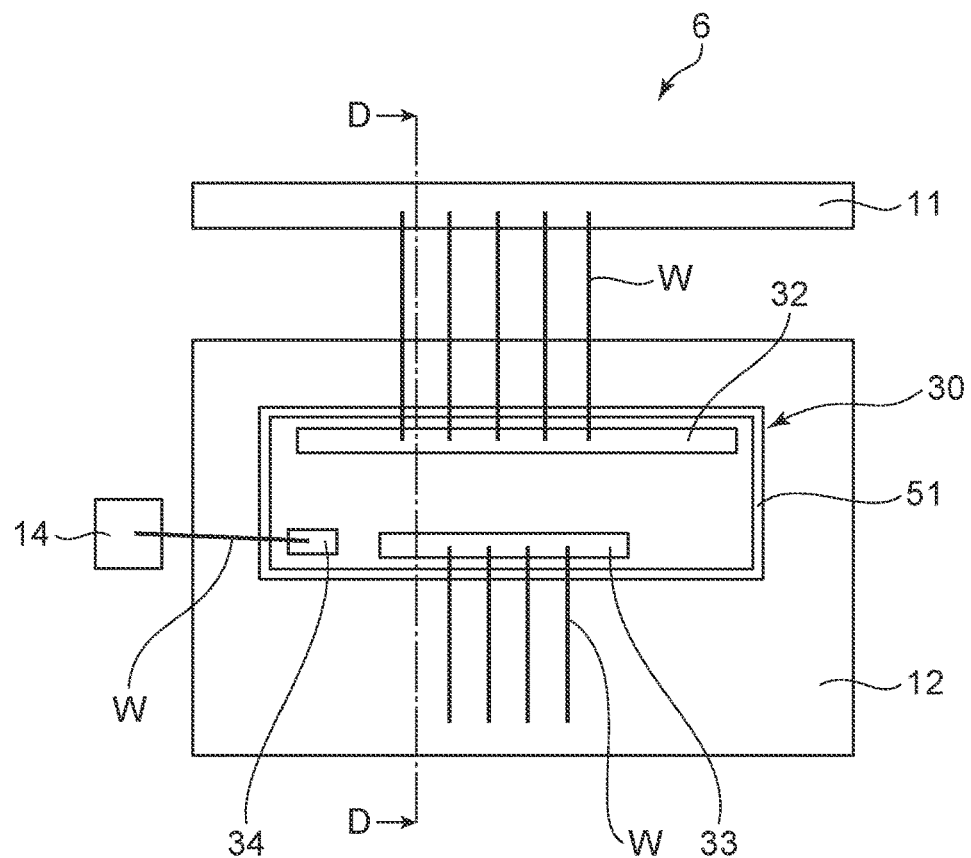
FIG. 12 is a schematic plan view of the semiconductor device of the sixth embodiment.
Figure 13:
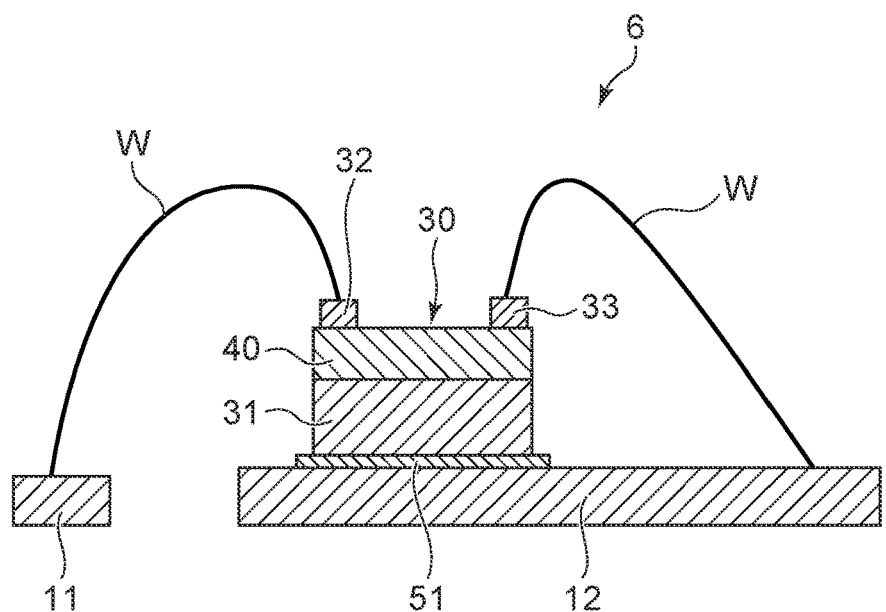
FIG. 13 is a schematic cross-sectional view illustrating a D-D cross section of FIG. 12.

A semiconductor device 6 of a sixth embodiment will now be described with reference to FIGS. 12 and 13.

The semiconductor device 6 does not include the second chip 20. The first chip 30 of the semiconductor device 6 includes, for example, a normally-off HEMT.

According to the sixth embodiment, the first chip 30 is mounted on the second terminal 12. The second terminal 12 also is used as the die pad to which the first chip 30 is mounted. The substrate 31 of the first chip 30 is bonded to the second terminal 12 by the bonding member 51. According to the second embodiment, the resistance part R includes the bonding member 51 that bonds the substrate 31 and the second terminal 12 (that also is used as the die pad).

Seventh Embodiment

Figure 14:
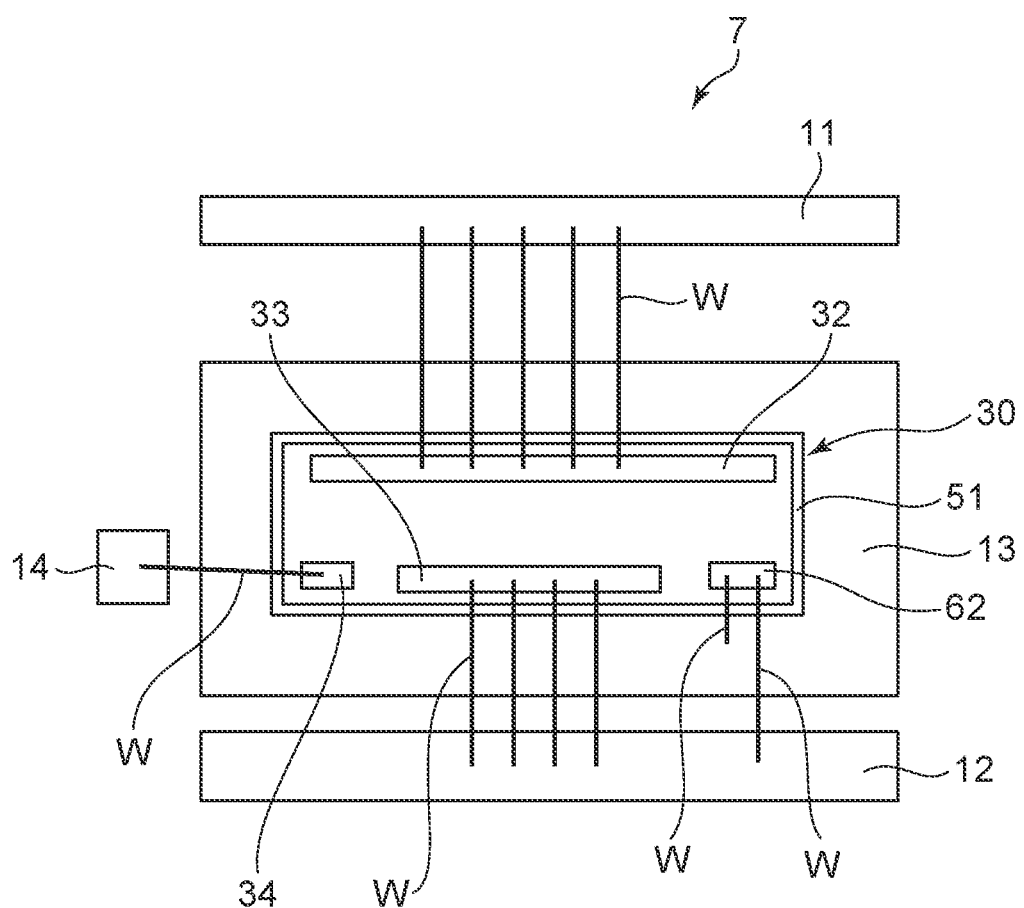
FIG. 14 is a schematic plan view of the semiconductor device of the seventh embodiment.

A semiconductor device 7 of a seventh embodiment will now be described with reference to FIG. 14.

The semiconductor device 7 does not include the second chip 20. The first chip 30 of the semiconductor device 7 includes, for example, a normally-off HEMT.

According to the seventh embodiment, the resistance part 62 is located on the first chip 30. The resistance part 62 is electrically connected to the die pad 13 and the second terminal 12 by the wires W.

Eighth Embodiment

A semiconductor device of an eighth embodiment does not include the second chip 20. The first chip 30 of the semiconductor device of the eighth embodiment includes, for example, a normally-off HEMT. According to the eighth embodiment, the resistance part R includes the resistance layer 63 that is located at the substrate 31 of the first chip 30. The resistance layer 63 may be provided in a region of the nitride semiconductor layer 41 or 42 between the first drain electrode 32 and the substrate 31.

Ninth Embodiment

Figure 15:
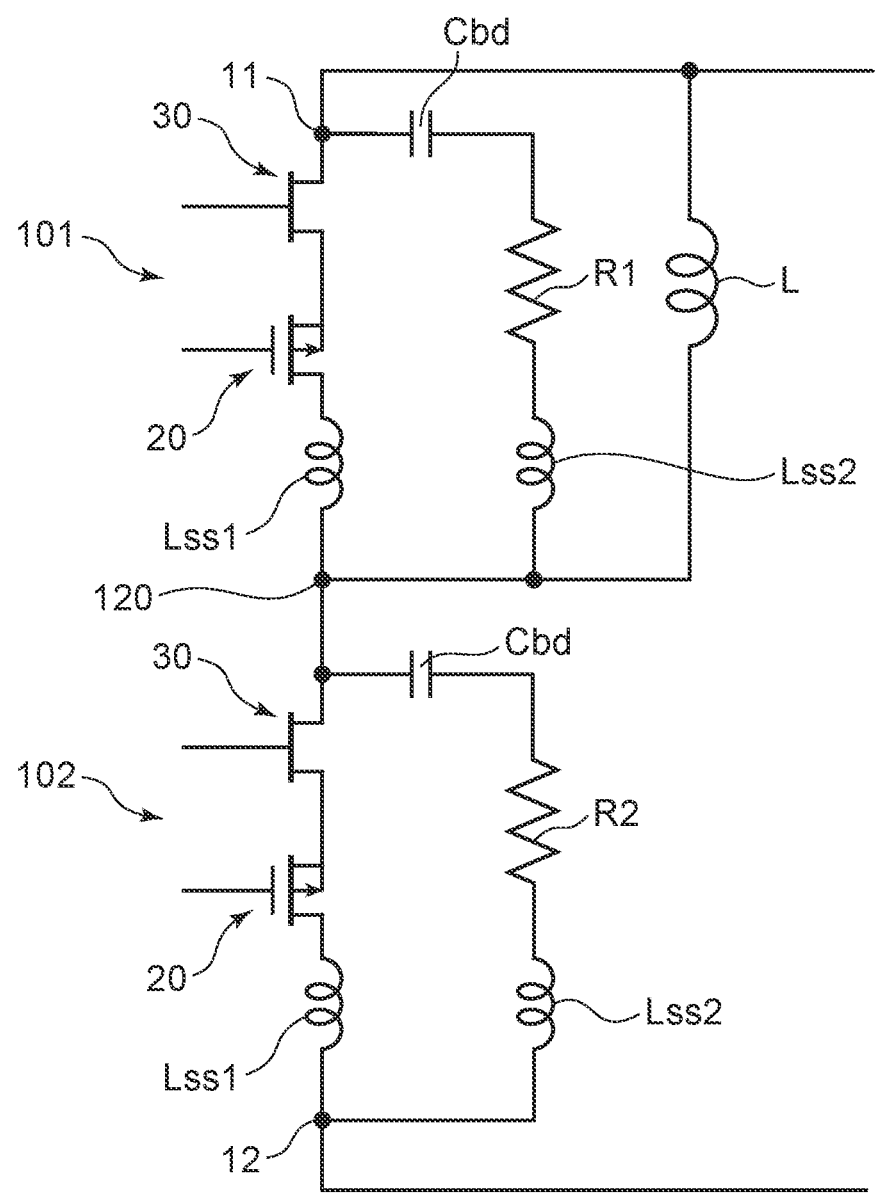
FIG. 15 is an equivalent circuit diagram of a semiconductor device of a ninth embodiment.

The semiconductor devices of the first to fourth embodiments that include the first and second chips 30 and 20 that have a cascode connection can be used in a half-bridge circuit of a power supply circuit as shown in FIG. 15.

The half-bridge circuit includes a high-side device 101 and a low-side device 102. The high-side device 101 and the low-side device 102 each include the first chip 30 and the second chip 20 that have the cascode connection.

The second drain electrode of the second chip 20 of the high-side device 101 and the first drain electrode of the first chip 30 of the low-side device 102 are connected to each other. A connection portion 120 between the second drain electrode of the second chip 20 of the high-side device 101 and the first drain electrode of the first chip 30 of the low-side device 102 is connected to a load L. The load L is connected between the first drain electrode (the first terminal 11) of the first chip 30 of the high-side device 101 and the connection portion 120 between the high-side device 101 and the low-side device 102. The connection portion 120 corresponds to the second terminal of the high-side device 101 and corresponds to the first terminal of the low-side device 102.

The parasitic inductance between the connection portion 120 (the second terminal) and the second drain electrode of the second chip 20 of the high-side device 101 is taken as Lss1. The parasitic inductance between the connection portion 120 (the second terminal) and the substrate capacitance Cbd of the first chip 30 of the high-side device 101 is taken as Lss2.

The high-side device 101 includes a resistance part R1 that is connected in series between the parasitic inductance Lss2 and the substrate capacitance Cbd of the first chip 30.

The parasitic inductance between the second terminal 12 and the second drain electrode of the second chip 20 of the low-side device 102 is taken as Lss1. The parasitic inductance between the second terminal 12 and the substrate capacitance Cbd of the first chip 30 of the low-side device 102 is taken as Lss2.

The low-side device 102 includes a resistance part R2 that is connected in series between the parasitic inductance Lss2 and the substrate capacitance Cbd of the first chip 30.

Results of simulations using the circuit shown in FIG. 15 will now be described.

A drain-source voltage Vds and a drain current Id of the low-side device 102 when turning on the low-side device 102 from dead time in which both the high-side device 101 and the low-side device 102 are in the off-state were calculated. The first chips 30 were normally-on HEMTs; and the second chips 20 were normally-off p-type channel MOSFETs. The potential of the first terminal 11 of the high-side device 101 was 400 V, the potentials of the connection portion 120 and the second terminal 12 of the low-side device 102 were 0 V, the parasitic inductance Lss1 was 0.2 nH, the parasitic inductance Lss2 was 0.02 nH, and the inductance of the load L was 200 μH.

Figures 16A, 16B:
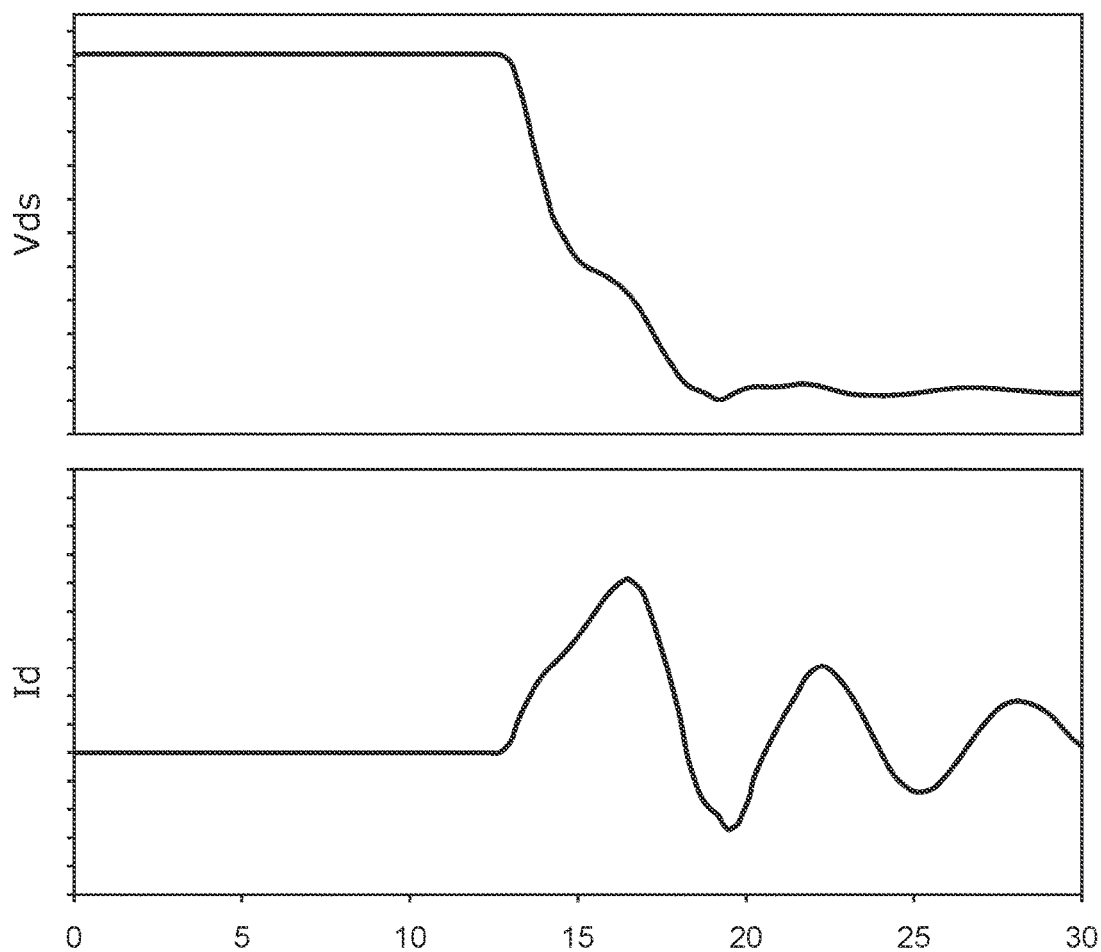
FIG. 16A is a waveform diagram of Vds of a simulation using the circuit of FIG. 15.
FIG. 16B is a waveform diagram of Id for the same conditions.

FIG. 16A is a waveform diagram of Vds when a gate resistance value Rg inserted into the gate of the second chip 20 of the low-side device 102 was 30Ω, the resistance value R2 of the resistance part R2 and the resistance value R1 of the resistance part R1 inserted into the line of the parasitic inductance Lss2 and the substrate capacitance Cbd of the high-side device 101 were 0Ω; and FIG. 16B is a waveform diagram of Id for the same conditions.

Figures 17A, 17B:
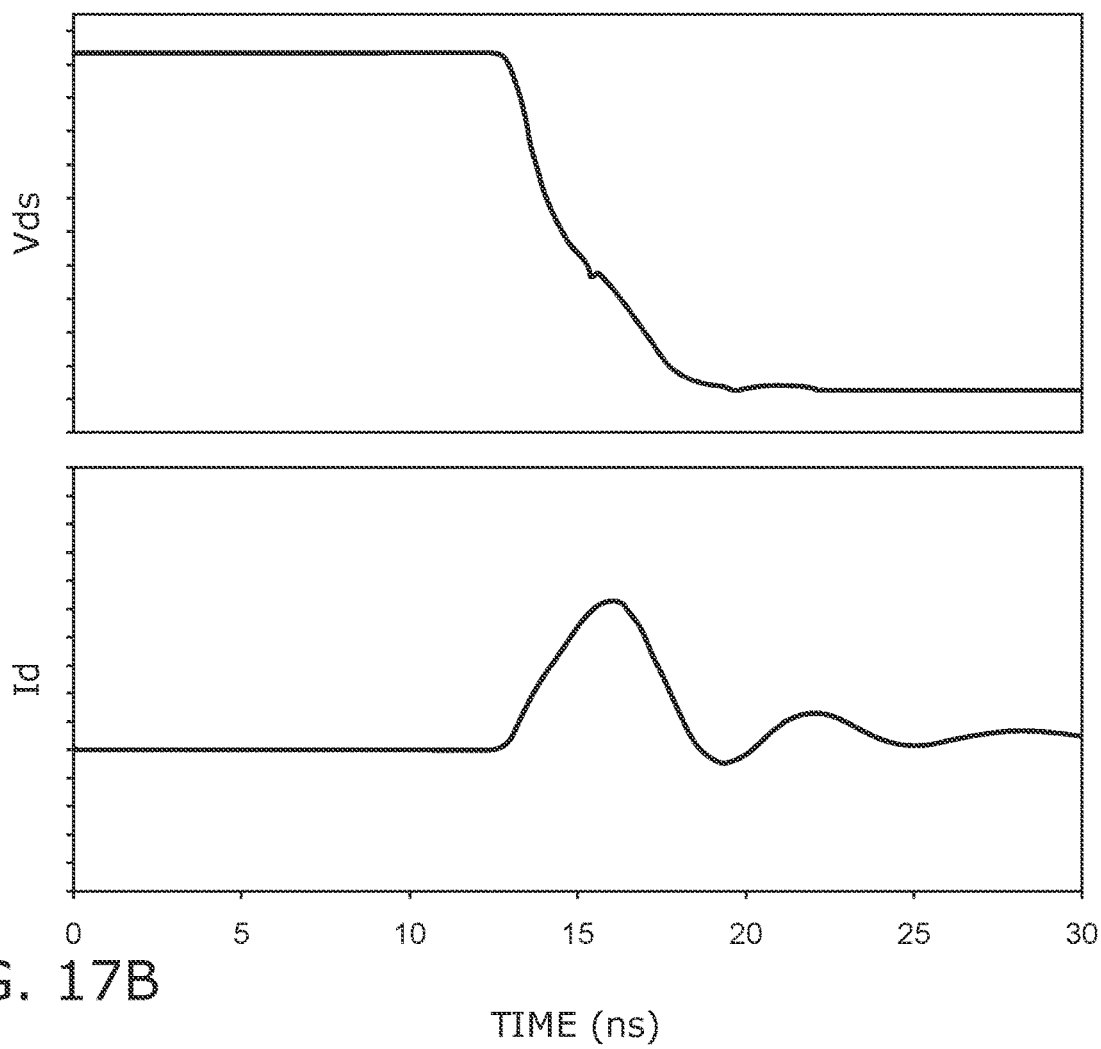
FIG. 17A is a waveform diagram of Vds of a simulation using the circuit of FIG. 15.
FIG. 17B is a waveform diagram of Id for the same conditions.

FIG. 17A is a waveform diagram of Vds when the aforementioned Rg was 30Ω, and the aforementioned R1 and R2 were 2.5Ω; and FIG. 17B is a waveform diagram of Id for the same conditions.

Figures 18A, 18B:
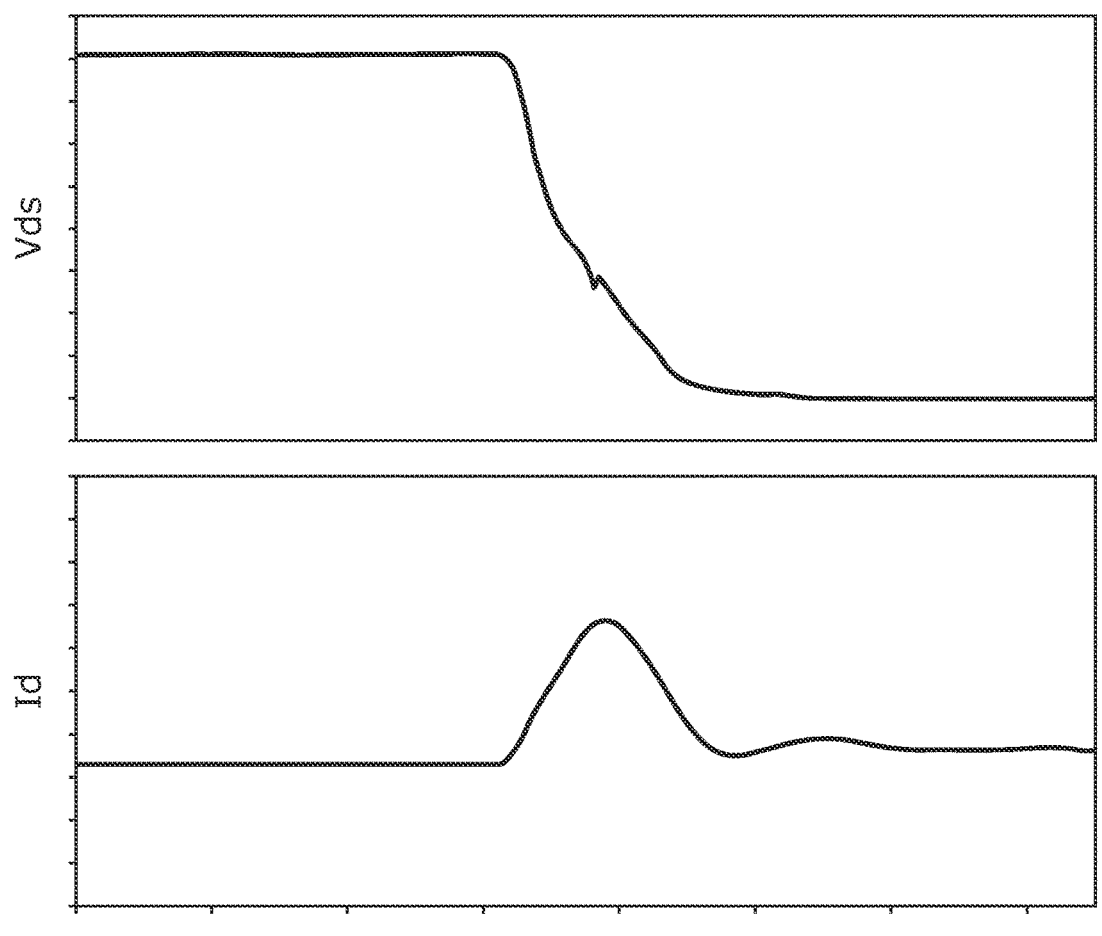
FIG. 18A is a waveform diagram of Vds of a simulation using the circuit of FIG. 15.
FIG. 18B is a waveform diagram of Id for the same conditions.

FIG. 18A is a waveform diagram of Vds when the aforementioned Rg was 30Ω, and the aforementioned R1 and R2 were 5Ω; and FIG. 18B is a waveform diagram of Id for the same conditions.

Figures 19A, 19B:
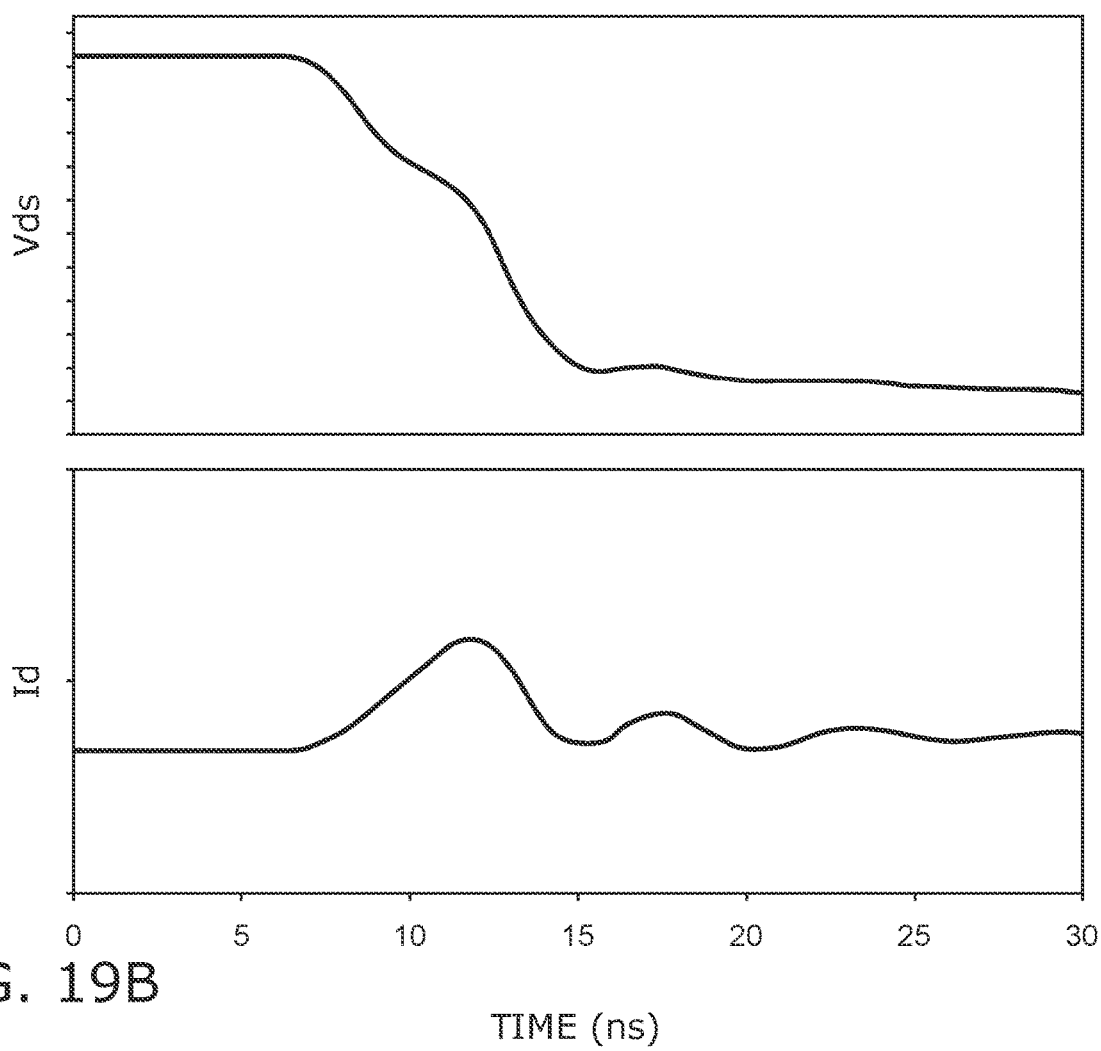
FIG. 19A is a waveform diagram of Vds of a simulation using the circuit of FIG. 15.
FIG. 19B is a waveform diagram of Id for the same conditions.

FIG. 19A is a waveform diagram of Vds when the aforementioned Rg was 100Ω, and the aforementioned R1 and R2 were 0Ω; and FIG. 19B is a waveform diagram of Id for the same conditions.

From the results of FIGS. 16A to 18B, for conditions having the same gate resistance Rg (30Ω), the ringing of the drain current Id can be suppressed by increasing the resistance values of the resistance parts (snubber resistances) R1 and R2 inserted into the lines of the substrate capacitance Cbd and the parasitic inductance Lss2. As shown in the result of FIG. 19B, it is necessary to use a large gate resistance Rg (100Ω) to use the gate resistance Rg to suppress the ringing of the drain current Id without providing the snubber resistances R1 and R2. However, increasing the gate resistance Rg may increase the switching loss and reduce the circuit efficiency.

Figure 20:
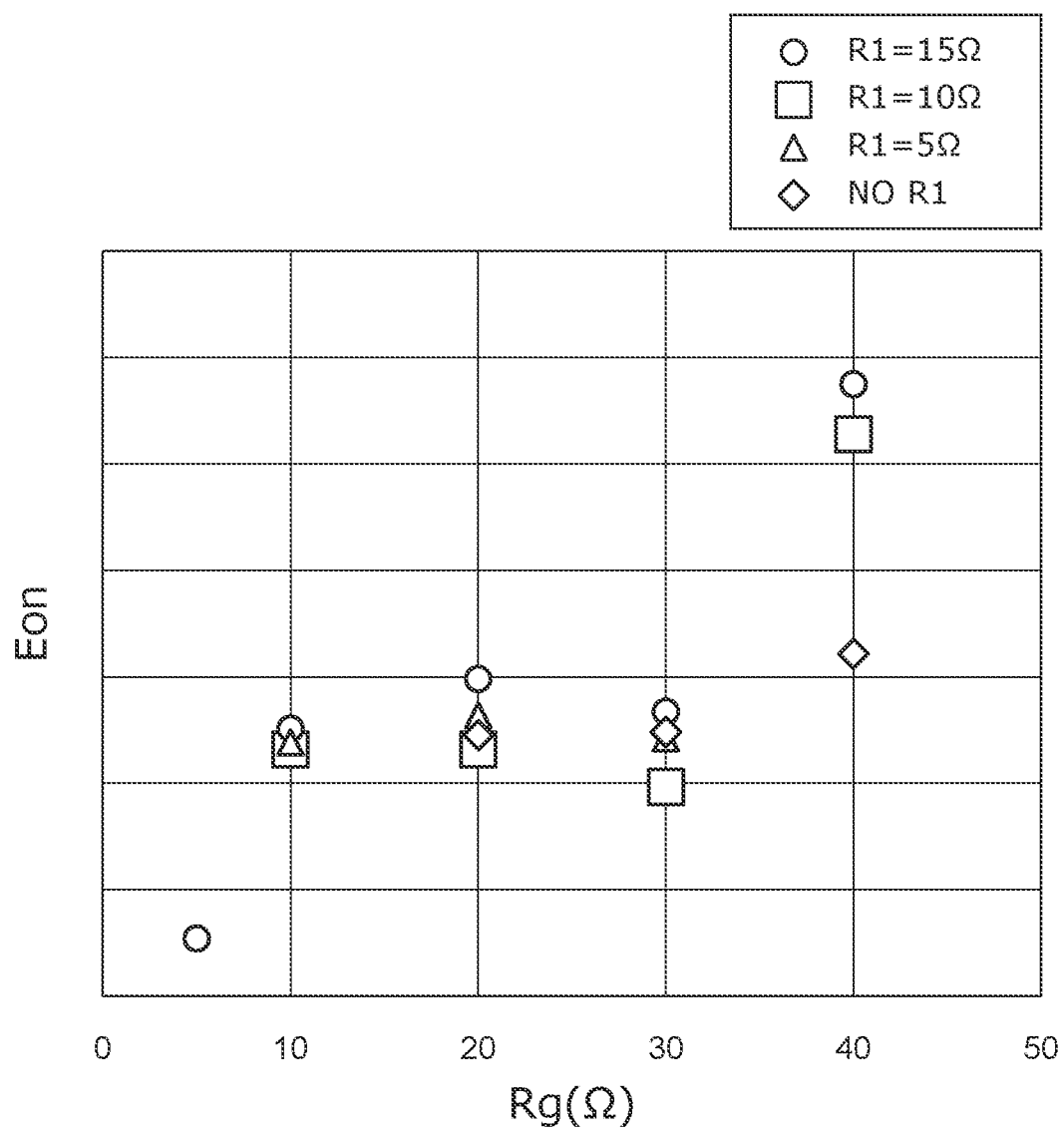
FIG. 20 is a graph showing a relationship between a gate resistance Rg and a switching loss Eon of a simulation using the circuit of FIG. 15.

FIG. 20 is a graph showing the relationship between a switching loss Eon, the resistance value R1 of the resistance part (snubber resistance) R1 of the high-side device 101, and the gate resistance Rg when the low-side device 102 of the circuit of FIG. 15 is turned on.

The switching loss Eon is the total of the loss of the first chip 30 of the high-side device 101, the loss of the first chip 30 of the low-side device 102, the loss of the resistance part (snubber resistance) R1 of the high-side device 101, and the loss of the resistance part (snubber resistance) R2 of the low-side device 102.

For the condition of the same gate resistance Rg, there is a tendency for the switching loss Eon to increase when the resistance value R1 is larger due to the loss of the snubber resistance R1. Even with the loss due to the snubber resistance R1, the gate resistance Rg can be reduced by inserting the snubber resistance R1 because the ringing of the drain current can be suppressed. As a result, the switching loss Eon can be reduced. For example, from the results of FIG. 20, the switching loss Eon can be reduced if the gate resistance Rg can be lowered to 5Ω and the ringing can be suppressed by setting the snubber resistance R1 to 15Ω.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a first terminal;
   a second terminal;
   a first chip comprising:
      a substrate electrically connected to the second terminal,
      a nitride semiconductor layer located on the substrate,
      a first drain electrode located on the nitride semiconductor layer and electrically connected to the first terminal,
      a first source electrode located on the nitride semiconductor layer and electrically connected to the second terminal,
      a lateral main current path between the first drain electrode and the first source electrode, and
      a substrate capacitance formed between the first drain electrode and the substrate without the inclusion of a separate capacitor; and
   a resistor connected in series in a path including the substrate capacitance between the first drain electrode and the second terminal, wherein a series resonance between the substrate capacitance and a parasitic inductance of one or more wires connected to the semiconductor device is absorbed by the resistor to suppress ringing of a drain current.

2. The device according to claim 1, further comprising:
   a second chip comprising:
      a second source electrode electrically connected to the first source electrode of the first chip, and
      a second drain electrode electrically connected to the second terminal.

3. The device according to claim 1, wherein
   the first chip includes a normally-on HEMT (High Electron Mobility Transistor), and
   the second chip includes a normally-off MOSFET (Metal-Oxide-Semiconductor Field Effect Transistor).

4. The device according to claim 1, further comprising:
   a die pad to which the first chip is mounted, the die pad being bonded to the substrate.

5. The device according to claim 4, wherein the resistor includes a chip resistor electrically connected between the die pad and the second terminal.

6. The device according to claim 4, wherein
   the die pad also is used as the second terminal, and
   the resistor includes a bonding member that bonds the substrate and the die pad.

7. The device according to claim 4, wherein the resistor is located on the first chip, and is electrically connected to the die pad and the second terminal by wires.

8. The device according to claim 1, wherein the resistor includes a resistance layer located at the substrate or the nitride semiconductor layer.

9. The device according to claim 1, wherein the substrate is a silicon substrate.

10. The device according to claim 1, wherein a resistance of the resistor is greater than a resistance of the substrate.

* * * * *